(12) United States Patent
Jung et al.

(10) Patent No.: US 9,281,217 B1
(45) Date of Patent: Mar. 8, 2016

(54) METHOD OF MANUFACTURING SEMICONDUCTOR MEMORY DEVICE

(71) Applicant: SK hynix Inc., Gyeonggi-do (KR)

(72) Inventors: Sung Wook Jung, Gyeonggi-do (KR); Ji Hui Baek, Gyeonggi-do (KR); Dong Hun Lee, Gyeonggi-do (KR); Tae Hwa Lee, Gyeonggi-do (KR); Hye Eun Heo, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/724,517

(22) Filed: May 28, 2015

(30) Foreign Application Priority Data

Jan. 5, 2015 (KR) .......................... 10-2015-0000885

(51) Int. Cl.
*H01L 21/4763* (2006.01)
*H01L 21/311* (2006.01)
*H01L 21/4757* (2006.01)
*H01L 27/115* (2006.01)

(52) U.S. Cl.
CPC .... *H01L 21/47573* (2013.01); *H01L 27/11521* (2013.01); *H01L 27/11556* (2013.01); *H01L 27/11568* (2013.01); *H01L 27/11582* (2013.01)

(58) Field of Classification Search
CPC .................... H01L 21/31144; H01L 21/47573
USPC ........................................ 438/702, 633, 638
See application file for complete search history.

(56) References Cited

U.S. PATENT DOCUMENTS

| 2006/0063351 | A1* | 3/2006 | Jain ....................... G02F 1/1362 438/455 |
| 2007/0196999 | A1* | 8/2007 | Tamura .................. H01L 21/84 438/458 |
| 2014/0339566 | A1* | 11/2014 | Seo ....................... H01L 33/007 257/76 |
| 2015/0179661 | A1* | 6/2015 | Huo ...................... H01L 21/764 257/57 |

FOREIGN PATENT DOCUMENTS

KR 1020080028878 4/2008
KR 1020100025820 3/2010

OTHER PUBLICATIONS

Radhakrishnan, H., et al., Improving the quality of epitaxial foils produced using a porous silicon-based layer transfer process for high-efficiency thin-film crystalline silicon solar cells, IEEE Journal of Photovoltaics, 2014, pp. 70-77, vol. 4, No. 1.
Milenkovic, N., et al., Reorganization of Porous Silicon: Effect on Epitaxial Layer Quality and Detachment, Energy Procedia, 2014, pp. 552-558, vol. 55.

* cited by examiner

*Primary Examiner* — Long K Tran
(74) *Attorney, Agent, or Firm* — IP & T Group LLP

(57) ABSTRACT

A method of manufacturing a semiconductor memory device includes forming a first attached layer on a substrate, forming a stack layer on the first attached layer, separating the stack layer and the first attached layer from each other, forming vertical holes by performing a first etch process on the stack layer in a direction from bottom to top, removing the first attached layer, attaching the stack layer in which the vertical holes are formed to the substrate, and performing a second etch process so that each of the vertical holes has a uniform width.

18 Claims, 8 Drawing Sheets

2

METHOD OF MANUFACTURING SEMICONDUCTOR MEMORY DEVICE

CROSS-REFERENCE TO RELATED APPLICATION

The present application claims priority to Korean patent application number 10-2015-0000885 filed on Jan. 5, 2015, the entire disclosure of which is herein incorporated by reference in its entirety.

BACKGROUND

1. Field of Invention

Various exemplary embodiments relate generally to a method of manufacturing a semiconductor memory device, and more particularly, to a method of manufacturing a three-dimensional memory device.

2. Description of Related Art

To manufacture high-capacity lightweight semiconductor memory devices, degrees of integration are being increased. Three-dimensional semiconductor memory devices are being developed to achieve a higher degree of integration. In a three-dimensional semiconductor memory device, memory cells coupled to word lines are stacked in a vertical direction from a substrate. Thus, as the number of word lines increases, the height or thickness of the memory cell stack, in which the word lines and insulating layers filled between the word lines are stacked, may also be increased.

When the height of the stacked structure including the word lines and the insulating layers increases, a difference in width of a hole or a trench may occur during a dry etch process of forming the hole or the trench in the stacked structure. For example, since the dry etch process is performed in a direction from top to bottom, the hole or the trench formed in the upper part of the stacked structure may be over-etched compared with the hole or the trench is formed in the lower part of the stacked structure. The difference in width along the height of the trench may lead to differences in electrical characteristics, causing degradation in reliability of semiconductor memory devices.

SUMMARY

An embodiment is directed to a method manufacturing a semiconductor memory device capable of reducing a difference in width of a hole or a trench.

One aspect of the present disclosure includes forming a first attached layer over a first substrate, forming a stack layer over the first attached layer, detaching the stack layer from the first attached layer, performing a first etch process to form a vertical hole in the stack layer in a first direction, removing the first attached layer, reversing the stack layer upside down and placing the reversed stack layer over a second substrate, and performing a second etch process against the reversed stack layer to make the vertical hole have a uniform width.

Another aspect of the present disclosure includes forming a first attached layer over a first substrate, forming a stack layer over the first attached layer, performing a first etch process to form a vertical hole in the stack layer, detaching the stack layer from the first attached layer, removing the first attached layer, reversing the stack layer and attaching the reversed stack layer over a second substrate, and performing a second etch process against the reversed stack layer to make the vertical hole have a uniform width.

DETAILED DESCRIPTION

Figure 1:
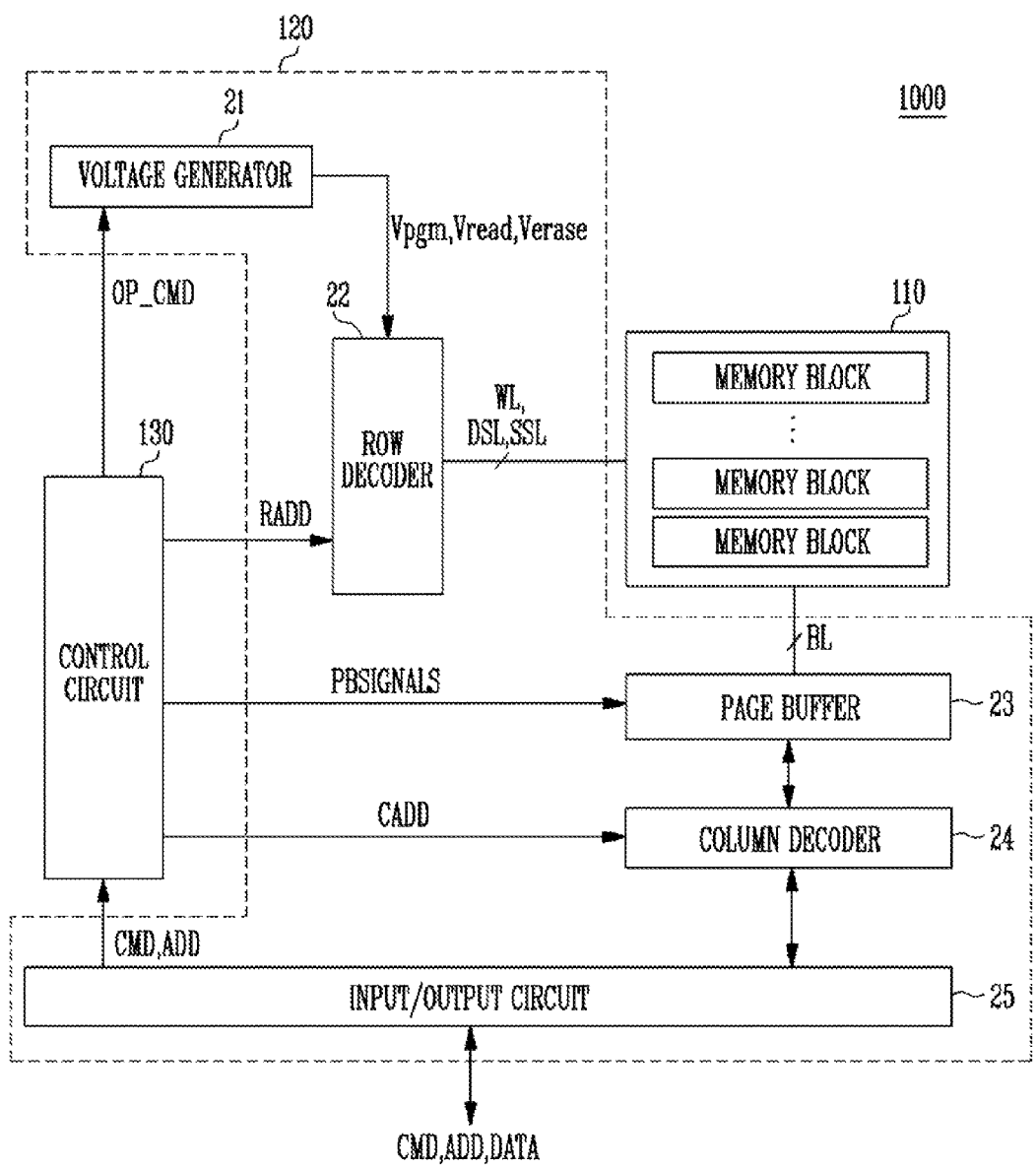
FIG. 1 is a schematic view illustrating a semiconductor device according to an embodiment.

Hereinafter, various exemplary embodiments will be described in detail with reference to the accompanying drawings. In the drawings, thicknesses and lengths of components may be exaggerated for convenience of illustration. In the following description, a detailed explanation of related functions and constitutions may be omitted for simplicity and conciseness of explanation. Like reference numerals refer to like elements throughout the specification and drawings.

FIG. 1 is a view diagram illustrating a semiconductor device according to an embodiment.

Referring to FIG. 1, a semiconductor device 1000 may include a memory cell array 110 storing data, a circuit group 120 configured to perform a program operation, a read operation or an erase operation on the memory cell array 110, and a control circuit 130 configured to control the circuit group 120.

The memory cell array 110 may include a plurality of memory blocks. Each of the memory blocks may include a plurality of strings composed of three-dimensional' semiconductor memory devices. Each of the plurality of strings may include a plurality of memory cells storing data, be arranged in three dimensions, and extend in a vertical direction to a substrate. The memory cells may include single level cells (SLC) storing one bit of data per cell, multi-level cells (MLC), triple level cells (TLC) or quadruple level cell (QLC) storing two or more bits of data per cell. More specifically, two bits of data may be stored in a single multi-level cell (MLC), three bits of data may be stored in a single triple level cell (TLC), and four bits of data may be stored in a single quadruple level cell (QLC).

The circuit group 120 may include a voltage generator 21, a row decoder 22, a page buffer 23, a column decoder 24 and an input/output circuit 25.

The voltage generator 21 may output operating voltages of various levels in response to an operation command signal OP_CMD. For example, the voltage generator 21 may generate a program voltage Vpgm, a read voltage Vread and an erase voltage Verase. In addition, the voltage generator 21 may generate various other voltages necessary to perform various operations.

The row decoder 22 may select one of the memory blocks included in the memory cell array 110 in response to a row address RADA, and transfer the operating voltages to word lines WL drain selection lines DSL and source selection lines SSL coupled to the selected memory block.

The page buffer 23 may be coupled to the memory blocks through bit lines BL, exchange data with the selected memory block during program, read and erase operations, and temporarily store the transferred data.

The column decoder 24 may exchange data the page buffer 23 in response to a column address CADD.

The input/output circuit 25 may transfer a command signal CMD and an address ADD, which are transferred from an external device, to the control circuit 130 transfer data DATA, which is transferred from an external device, to the column decoder 24, and output the data DATA received from the column decoder 24 to an external device, or transfer the data DATA to the control circuit 130.

The control circuit 130 may control the circuit group 120 in response to the command signal CMD and the address ADD. For example, the control circuit 130 may control the circuit group 120 to perform a program operation, a read operation or an erase operation in response to the command signal CMD.

Figure 2:
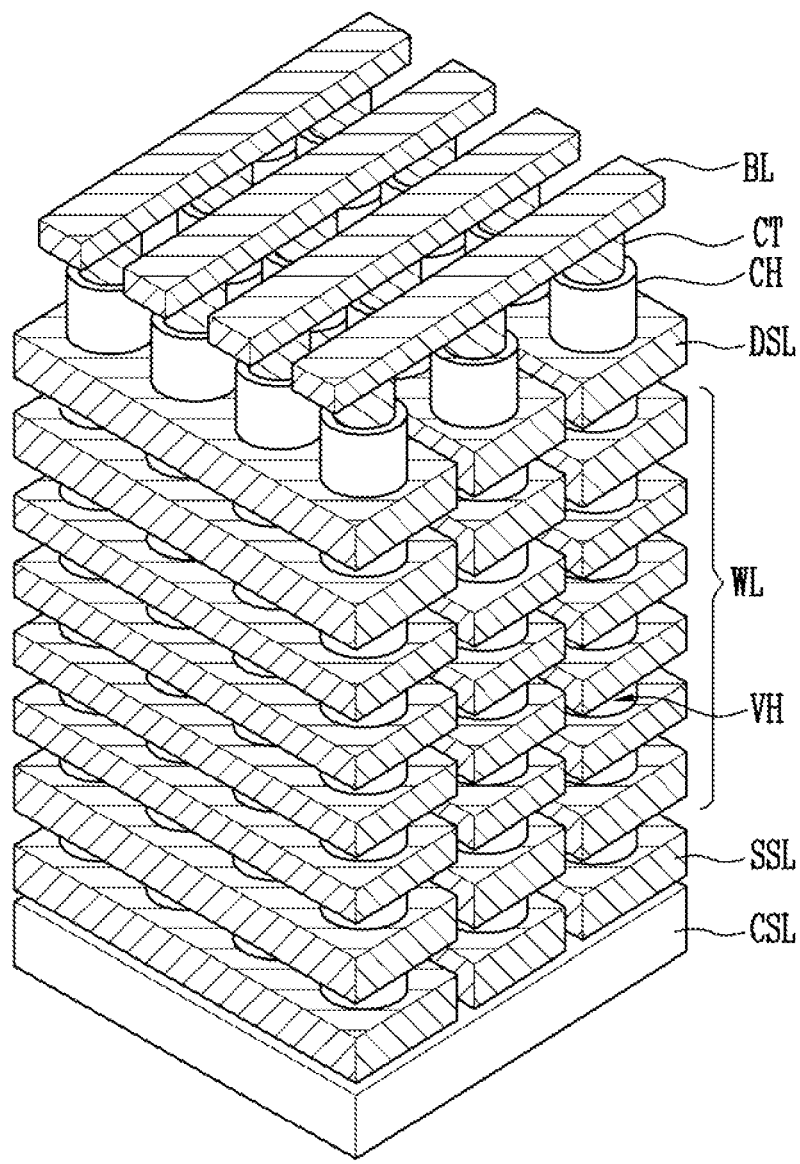
FIG. 2 is a perspective view illustrating an embodiment of a three-dimensional memory device.

FIG. 2 is a perspective view illustrating an embodiment of a three-dimensional semiconductor memory device.

Referring to FIG. 2, cell strings of a three-dimensional semiconductor memory device may be configured into various structures. According to an embodiment, the cell strings may be formed in I-shape.

The cell strings may be arranged in a vertical direction between the bit lines BL and a common source line CSL. The structure of this memory string may be referred to as a Bit Cost Scalable (BiCS). For example, when the common source line CSL is formed in a horizontal direction which is in parallel to an upper surface of the substrate, the strings having a BiCS structure may be formed in a vertical direction that is perpendicular to the direction in which the common source line CSL extends. More specifically, the cell strings may include the source lines SSL, the word lines WL and the drain selection lines DSL. The source lines SSL, the word lines WL and the drain selection lines DSL, may be arranged in a first direction and separated from each other. Though not shown in FIG. 2, insulating layers may be formed between the common source line CSL, the source lines SSL, the word lines WL and the drain selection lines DSL. In addition, the cell strings may include vertical holes VH and vertical channel layers CH formed in the vertical holes VH. The vertical holes VH may vertically pass through the drain selection lines DSL, the word lines WL, the source lines SSL and the common source line CSL. The bit lines BL arranged in a second direction that is, the vertical first direction perpendicular to the first direction that is, the horizontal direction, may be formed on the vertical channel layers CH. Contact plugs CT may be further formed between the bit lines BL and the vertical channel layers CH.

Figure 3:
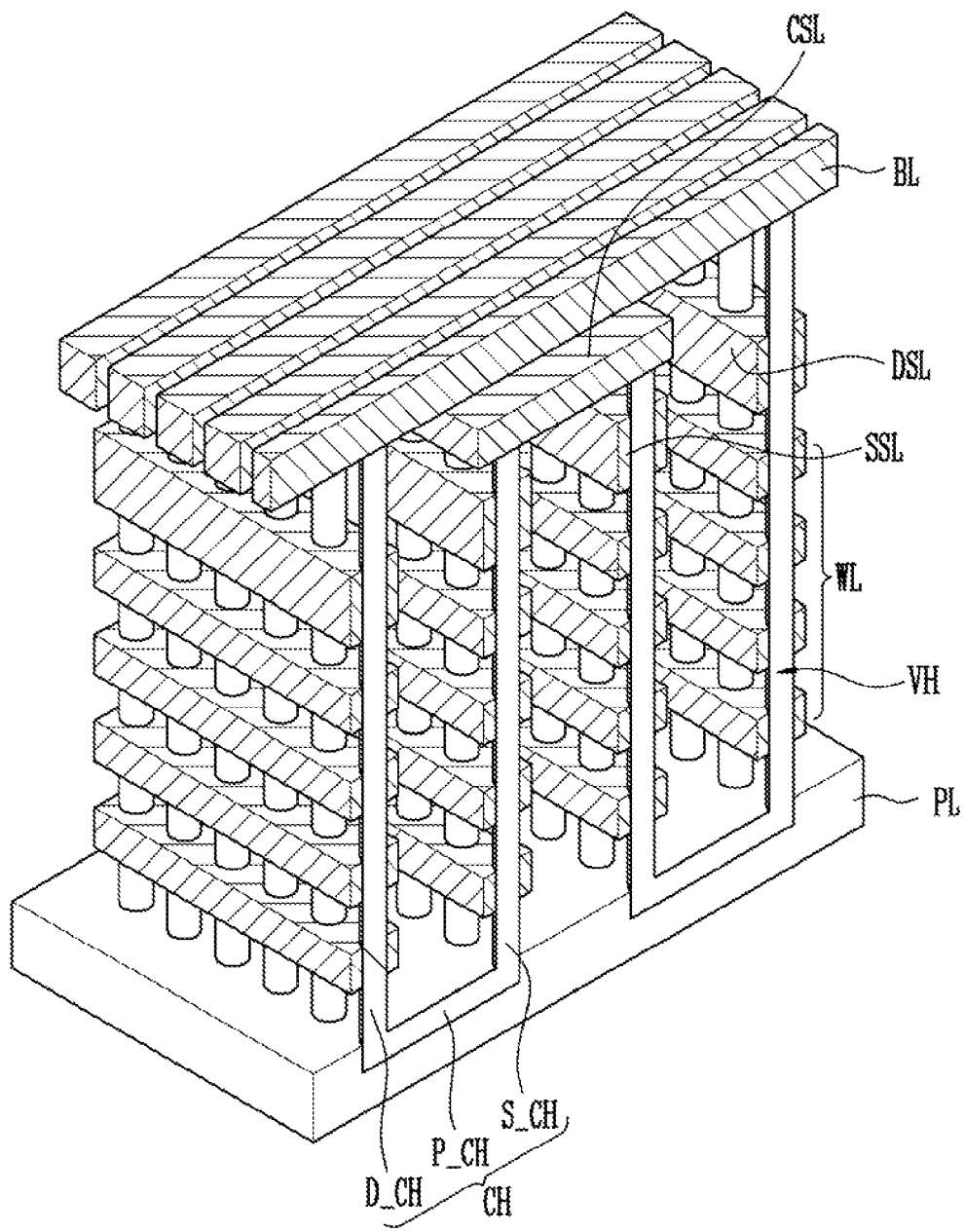
FIG. 3 is a perspective view illustrating another embodiment of a three-dimensional memory device.

FIG. 3 is a perspective view illustrating another embodiment of a three-dimensional semiconductor memory device. Referring to FIG. 3 the cell strings may be formed in U shape.

The cell strings may include first sub-strings arranged in the vertical direction between the bit lines BL and a pipe line PL, second sub-strings arranged in the vertical direction between the common source line CSL and the pipe line PL, and the pipe PL coupling the first sub-strings and the second sub-strings to each other. The structure of the above cell string may be referred to as a Pipe-shaped Bit Cost Scalable (P-BiCS) structure. For example, when the pipe line PL is formed in the horizontal direction, the cell strings having a P-BiCS structure may include first sub-strings formed in the vertical direction and located between the bit lines BL and the pipe line PL, and second sub-strings formed in the vertical direction and located between the common source lines CSL and the pipe line PL. More specifically, the first sub-strings may include the word lines WL, the drain selection lines DSL, and first vertical channel layers D_CH passing through the word lines WL and the drain selection lines DSL in the vertical direction. The word lines WL and the drain selection lines DSL may be arranged in the first direction that is, the horizontal direction, stacked over each other, and separated from each other. The second sub-strings may include the word lines WL, the source selection lines SSL, and second vertical channel layers S_CH passing through the word lines WL and the source selection lines SSL in the vertical direction. The word lines WL and the source selection lines SSL may be arranged in the first direction, stacked over each other, and separated from each other.

Though not shown in FIG. 3, insulating layers may be formed between the word lines WL, the source selection lines SSL and the drain selection lines DSL. The first vertical channel layers D_CH and the second vertical channel layers S_CH may be formed in the vertical holes VH passing through the word lines WL, the source selection lines SSL, and the drain selection lines DSL. The first vertical channel layers D_CH and the second vertical channel layers S_CH may be coupled to each other by pipe channel layers P_CH in the pipe line PL. The bit lines BL may contact top portions of the first vertical channel layers D_CH protruding above top surfaces of the drain selection lines DSL and be arranged in the second direction perpendicular to the first direction.

A method of manufacturing the vertical holes VH in the structures described above with reference to FIGS. 2 and 3 is described below in detail.

Figure 4:
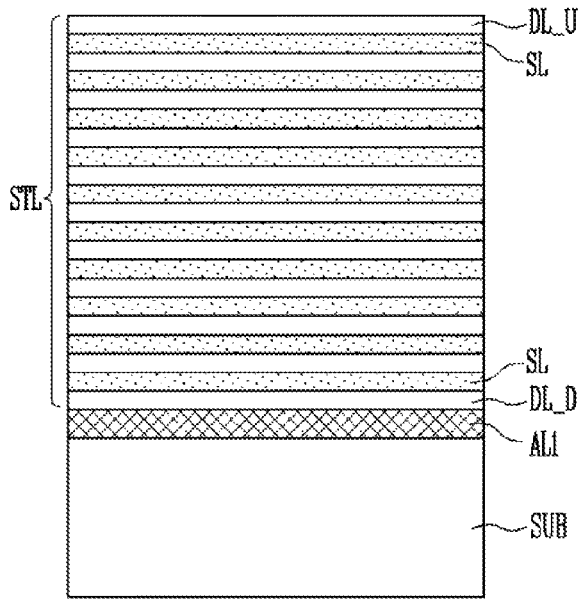
FIGS. 4 to 8 are cross-sectional views illustrating method of manufacturing a semiconductor memory device according to an embodiment.

FIGS. 4 to 8 are cross-sectional views illustrating a method of manufacturing a semiconductor memory device according to an embodiment. Referring to FIG. 4, a first attached layer AL1 may be formed on a substrate SUB. The first attached layer AL1 may include a porous material so that a stack layer STL which will be formed during subsequent processes, may be easily separated from the first attached layer AL1. For example, the first attached layer AL1 may include SiOx, SiNx where x is a positive integer, α-Si (amorphous silicon) or an organic layer which has high porosity. The stack layer STL may be formed by alternately stacking the insulating layers DL and sacrificial layers SL over the first attached layer AL1. An insulating layer forming a bottom layer of the stack layer STL may be defined as a lower insulating layer DL_D, and an insulating layer forming a top layer of the stack layer STL may be defined as an upper insulating layer DL_U. The insulating layers DL may be oxide layers, and the sacrificial layers SL may be nitride layers.

Figure 5:
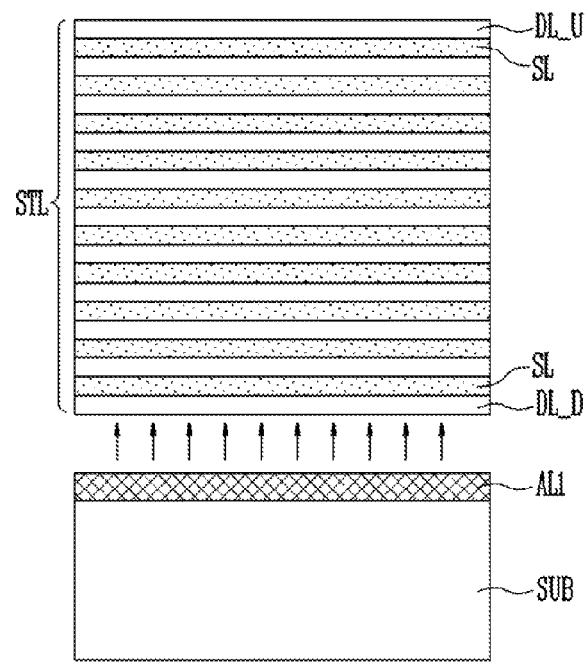

Referring to FIG. 5, the stack layer STL formed over the first attached layer AL1 may be separated or detached from the first attached layer AL1. Various methods may be used to separate the stack layer STL from the first attached layer AL1. For example, a physical method or a chemical method may be used to separate the stack layer STL from the first attached layer AL1. According to the physical method, since the first attached layer AL1 has low strength due to high porosity, the stack layer STL may be separated from the first attached layer AL1 by applying a force to the stack layer STL when the substrate SUB is fixed. According to the chemical method, a heat treatment, hydrofluoric acid (HF), or a laser may be used. When the laser is used, irradiating the laser onto a rear surface of the substrate SUB may weaken the bond between the first attached layer AL1 and the substrate SUB so that the stack layer STL may be separated from the substrate SUB.

Figure 6:
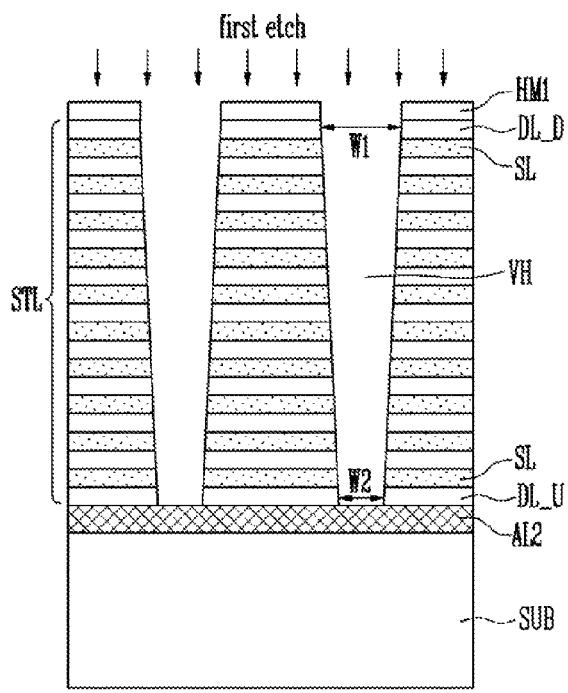

Referring to FIG. 6, the stack layer STL may be turned over that is, turned upside down so that the lower insulating layer DL_D may be on top of the stack layer STL. The first etch process may be performed after the overturned stack layer STL is attached to the substrate SUB again. Various methods may be used to attach the stack layer STL to the substrate SUB again. For example, the first attached layer AL1 may be removed from the substrate SUB, a second attached layer AL2 may be formed on the substrate SUB, and the stack layer STL may be attached to a top surface of the second attached layer AL2. For example, the second attached layer AL2 may include silicon-based Pressure Sensitive Adhesive (PSA), acrylate, urethane or inorganic chelate.

However, without forming the second attached layer AL2, an aqueous solution may be used to attach the stack layer STL to the substrate SUB. For example, a top surface of the substrate SUB may be cleaned to remove the first attached layer AL1, the substrate SUB may be rinsed with DI water, the top surface of the substrate SUB may be altered into a hydrophilic surface, the stack layer STL may be located at the hydrophilic surface, and heat treatment may be carried out to attach the stack layer STL to the substrate SUB. A first mask pattern HM1 may be formed on the lower insulating layer DL_D, and the first etch process may be performed to pattern the stack layer STL in a direction from the lower insulating layer DL_D exposed through an opening of the first mask pattern HM1 to the upper insulating layer DL_U, so that the vertical holes VH may be formed through the insulating layers DL and the sacrificial layers SL. The etch process may be a dry etch process. Preferably, a hole or a trench formed by the etching may have equal upper and lower widths. However, in actuality, due to characteristics of a dry etch process, a width W1 of the vertical holes VH at a region where the lower insulating layer DL_D is formed may be greater than a width W2 of the vertical holes VH at a region where the upper insulating layer DL_U is formed.

Figure 7:
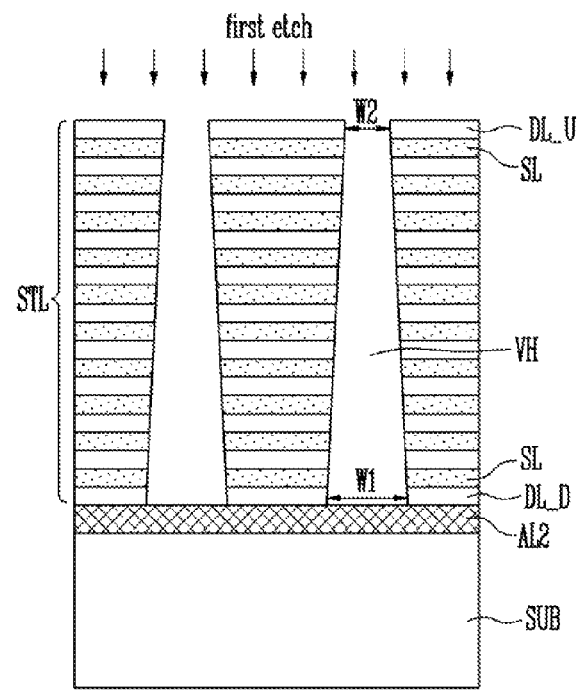

Referring to FIG. 7, when the stack layer STL in which the vertical holes VH are formed is attached to the second attached layer AL2, the upper insulating layer DL_U is placed on the top and the lower insulating layer DL_D is placed on the bottom. Therefore, the stack layer STL in which the upper width W2 of the vertical holes VH is smaller than the lower width W1 thereof may be formed on the second attached layer AL2. A method of attaching the stack layer STL to the substrate SUB may be substantially the same as the method described above with reference to FIG. 6. Furthermore, the detaching of the stack layer STL, the overturning of the detached stack layer STL and the attaching the overturned stack layer STL may be performed after the first etch process is performed.

Figure 8:
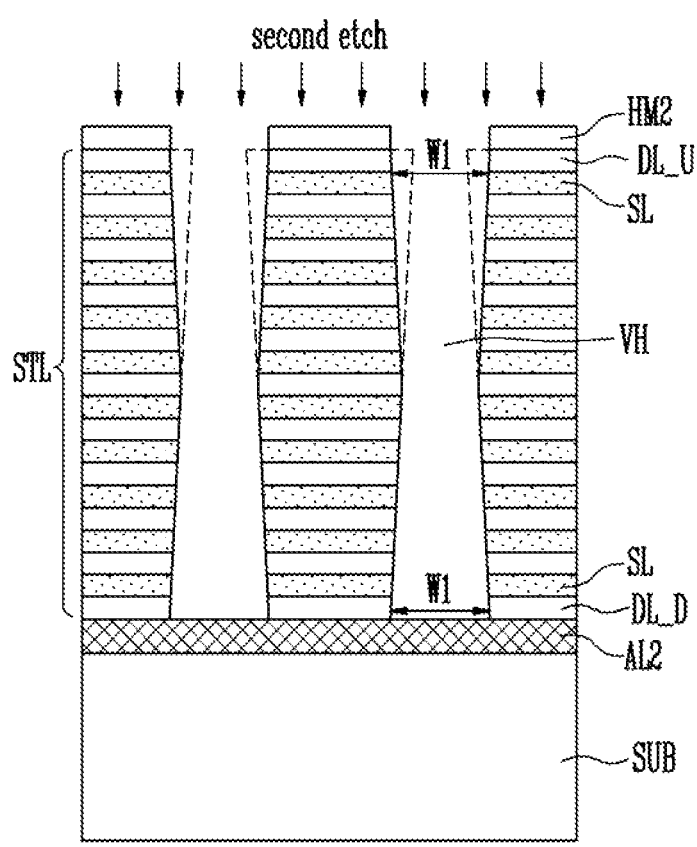

Referring to FIG. 8, a second mask pattern HM2 may be formed on the upper insulating layer DL_U, and a second etch process may be performed to remove the stack layer STL in a direction from the upper insulating layer DL_U exposed through an opening of the second mask pattern HM2 to the lower insulating layer DL_D. The second mask pattern HM2 may have substantially the same pattern as the first mask pattern HM1. The second etch process may be performed to further pattern the stack layer STL from the upper insulating layer DL_U exposed through the opening of the second mask pattern HM2 to the lower insulating layer DL_D. The second etch process may be performed so that the vertical holes VH may have a uniform width. As a result, the upper and lower widths of the vertical holes VH may be substantially equal to each other, and the difference between the intermediate width and upper or lower width of the vertical holes VH may also be reduced.

Figure 9:
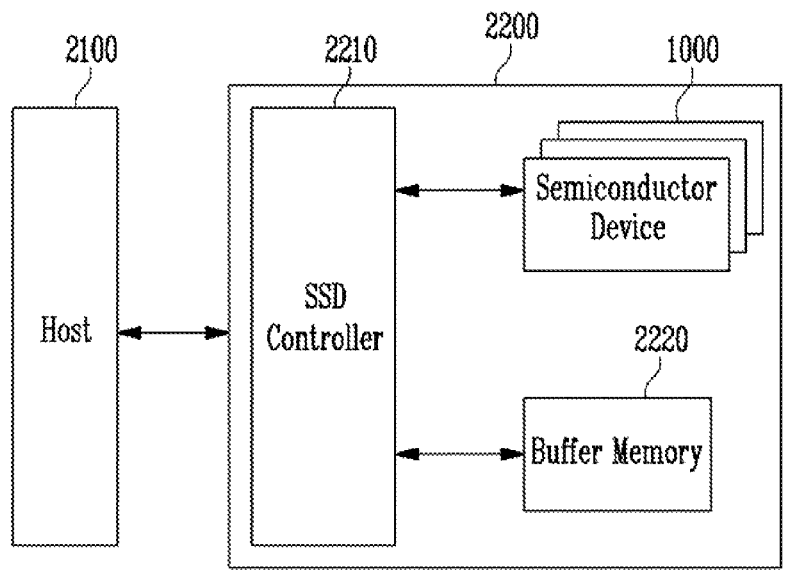
FIG. 9 is a block diagram illustrating a solid state drive including a semiconductor device according to an embodiment.

FIG. 9 is a block diagram illustrating a solid state drive including a semiconductor device according to an embodiment of the present invention.

Referring to FIG. 9, a drive device 2000 may include a host 2100 and an SSD 2200. The SSD 2200 may include an SSD controller 2210, a buffer memory 2220 and a semiconductor device 1000.

The SSD controller 2210 may provide a physical connection between the host 2100 and the SSD 2200. That is, the SSD controller 2210 may perform interfacing with the SSD 2200 in response to a bus format of the host 2100. The SSD controller 2210 may decode a command provided from the host 2100. According to a decoding result, the SSD controller 2210 may access the semiconductor device 1000. The bus format of the host 2100 may include Universal Serial Bus (USB), Small Computer System Interface (SCSI), Peripheral Component Interconnect Express (PCI-E), Advanced Technology Attachment (ATA), Parallel ATA (PATH), Serial ATA (SATA), and Serial Attached SCSI (SAS).

The buffer memory 2220 may temporarily store program data provided from the host 2100 or data read from the semiconductor device 1000. When a read request is made by the host 2100 and if data in the semiconductor device 1000 is cached, the buffer memory 2220 may support a cache function to directly provide the cached data to the host 2100. In general, data transfer speed by the bus format for example, SATA or SAS of the host 2100, may be higher than the transfer speed of a memory channel of the SSD 2200. That is, when an interface speed of the host 2100 is higher than the transfer speed of the memory channel of the SSD 2200, performance degradation caused by the speed difference may be minimized by providing a buffer memory 2220 having a large capacity. The buffer memory 2220 may be provided as Synchronous DRAM to provide sufficient buffering in the SSD 2200.

The semiconductor device 1000 may serve as a storage medium of the SSD 2200. For example, the semiconductor device 1000 may be provided as a nonvolatile memory device having large storage capacity as described above in detail with reference to FIG. 1. The semiconductor device 1000 may be a NAND-type flash memory.

Figure 10:
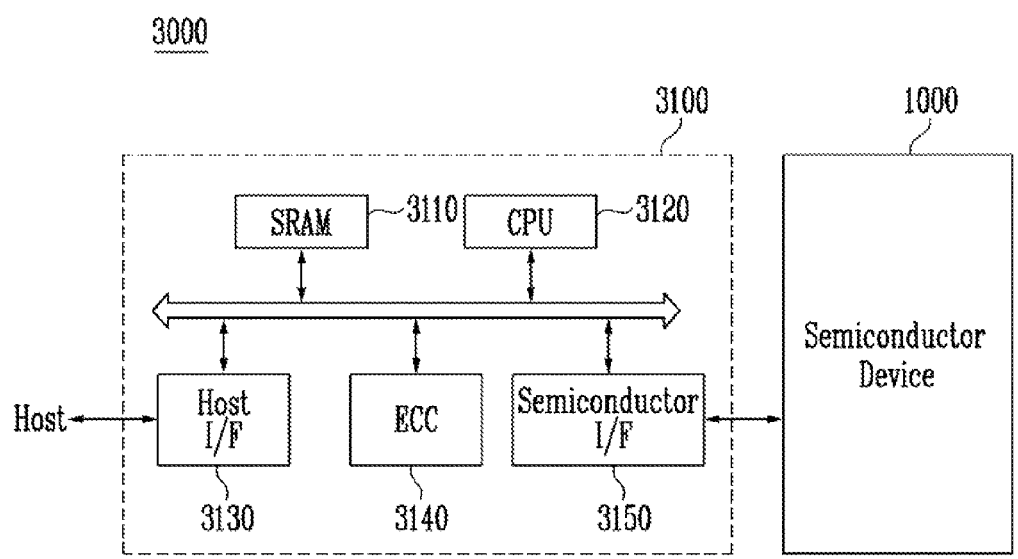
FIG. 10 is a block diagram illustrating a memory system including a semiconductor device according to an embodiment.

FIG. 10 is a block diagram illustrating a memory system including a semiconductor device according to an embodiment of the present invention. Referring to FIG. 10, a memory system 3000 according to an embodiment may include a memory control unit 3100 and the semiconductor device 1000. Since the semiconductor device 1000 may have substantially the same configuration as shown in FIG. 1, a detailed description thereof may be omitted.

The memory control unit 3100 may be configured to control the semiconductor device 1000. A static random-access memory (SRAM) 3110 may be used as a working memory of a CPU 3120. A host interface (I/F) 3130 may include a data exchange protocol of a host which is electrically coupled with the memory system 3000. An error correction circuit (ECC) 3140 in the memory control unit 3100 may detect and correct an error in data read from the semiconductor device 1000. A semiconductor I/F 3150 may interface with the semiconductor device 1000. The CPU 3120 may perform a control operation for data exchange of the memory control unit 3100. In addition, although not illustrated in FIG. 10, a read only memory (ROM) (not shown) for storing code data for interfacing with a host may be provided in the memory system 3000.

In an embodiment, the memory system 3000 may be applied to one of a computer, an Ultra Mobile PC (UMPC), a workstation, a net-book, a PDA, a portable computer, a web tablet, a wireless phone, a mobile phone, a smartphone, a digital camera, a digital audio recorder, a digital audio player, a digital picture recorder, a digital picture player, a digital video recorder, a digital video player, a device of transmitting and receiving information in a wireless environment, and various devices constituting a home network.

Figure 11:
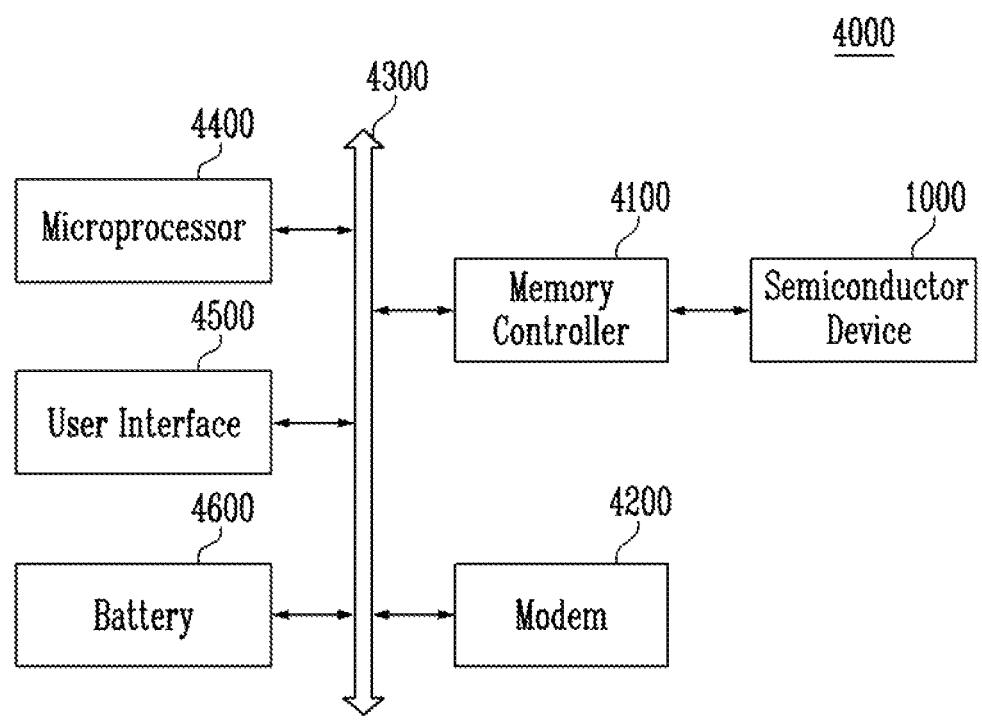
FIG. 11 is a view illustrating the configuration of a computing system including a semiconductor device according to an embodiment.

FIG. 11 is a block diagram illustrating a computing system 400 including a semiconductor device according to an embodiment. Referring to FIG. 11, the computing system 4000 includes the semiconductor device 1000 a memory controller 4100, a modem 4200, a microprocessor 4400, and a user interface 4500 which are electrically coupled to a bus 4300. When the computing system 4000 is a mobile device a battery 4600 for supplying an operation voltage of the computing system 4000 may be additionally provided. Though not illustrated in FIG. 11, the computing system 4000 may include an application chip set (not shown), a camera image processor (CIS) (not shown), a mobile DRAM (not shown), and the like.

The semiconductor device 1000 may be configured in substantially the same manner as the semiconductor device 1000 shown in FIG. 1. Thus, a detailed description thereof will be omitted.

The memory controller 4100 and the semiconductor device 1000 may be components of a Solid State Drive/Disk (SSD). The semiconductor device 1000 and the memory controller 4100 may be mounted using various types of packages. For example, the semiconductor device 1000 and the memory controller 4100 may be mounted using packages such as Package on Package (PoP), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flat Pack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-level Processed Stack Package (WSP), and the like.

According to an embodiment, when a hole or a trench of a three-dimensional semiconductor memory device is formed, a difference between upper and lower widths of the hole or the trench may be reduced. In addition to the three-dimensional semiconductor memory device, a width difference caused by a height difference or due to a high aspect ratio of a target which will be etched during an etch process may be reduced, preventing variations in electrical characteristics of the semiconductor memory device.

What is claimed is:

1. A method of manufacturing a semiconductor memory device, the method comprising:
   forming a first attached layer over a first substrate;
   forming a stack layer over the first attached layer;
   detaching the stack layer from the first attached layer;
   performing a first etch process to form a vertical hole in the stack layer in a first direction;
   removing the first attached layer;
   reversing the stack layer upside down and placing the reversed stack layer over a second substrate; and
   performing a second etch process against the reversed stack layer to make the vertical hole have a uniform width.

2. The method of claim 1, wherein the first attached layer includes a porous material.

3. The method of claim 2, wherein the first attached layer includes SiOx, SiNx, amorphous silicon (α-Si), or an organic layer, where is x is a positive integer.

4. The method of claim 1, wherein the stack layer is formed by stacking an oxide layer and a nitride layer.

5. The method of claim 1, wherein after the stack layer detached from the first attached layer is turned over, the first etch process is performed on the reversed stack layer.

6. The method of claim 1, wherein, before the second etch process, the vertical hole formed in the reversed stack layer has a width larger at a bottom than at a top.

7. The method of claim 1,
   wherein the first substrate and the second substrate are the same as each other, and
   wherein the placing of the reversed stack layer over the second substrate comprises:
      rinsing the first substrate with DI water;
      altering a top surface of the first substrate into a hydrophilic surface;
      placing the reversed stack layer on the hydrophilic surface; and
      performing a heat treatment process against the reversed stack layer.

8. The method of claim 1, further comprising:
   forming a second attached layer over the second substrate before placing the reversed stack layer over the second substrate.

9. The method of claim 8, wherein the second attached layer includes silicon-based Pressure Sensitive Adhesive (PSA), acrylate, urethane, or inorganic chelate.

10. The method of claim 1, wherein the first etch process is performed using a first mask pattern, and
    wherein the second etch process performed using the first mask pattern.

11. A method of manufacturing a semiconductor memory device, the method comprising:
    forming a first attached layer over a first substrate;
    forming a stack layer over the first attached layer;
    performing a first etch process to form a vertical hole in the stack layer;
    detaching the stack layer from the first attached layer;
    removing the first attached layer;
    reversing the stack layer and attaching the reversed stack layer over a second substrate; and
    performing a second etch process against the reversed stack layer to make the vertical hole have a uniform width.

12. The method of claim 11, wherein the first attached layer includes a porous material.

13. The method of claim 12, wherein the first attached layer includes SiOx, SiNx, amorphous silicon (α-Si), or an organic layer, where x is a positive integer.

14. The method of claim 11, wherein the stack layer is formed by stacking an oxide layer and a nitride layer.

15. The method of claim 11,
    wherein the first substrate and the second substrate are the same as each other, and
    wherein the attaching of the reversed stack layer over the second substrate comprises:
       rinsing the first substrate with DI water;
       altering a top surface of the first substrate into a hydrophilic surface;
       placing the reversed stack layer on the hydrophilic surface; and
       performing a heat treatment process against the reversed stack layer.

16. The method of claim 11, further comprising:
    forming a second attached layer over the second substrate before attaching the reversed stack layer over the second substrate.

17. The method of claim 16, wherein the second attached layer includes silicon-based Pressure Sensitive Adhesive (PSA), acrylate, urethane, or inorganic chelate.

18. The method of claim 11, wherein the first etch process is performed using a first mask pattern; and wherein the second etch process is performed using the first mask pattern.

* * * * *